Figure 1:
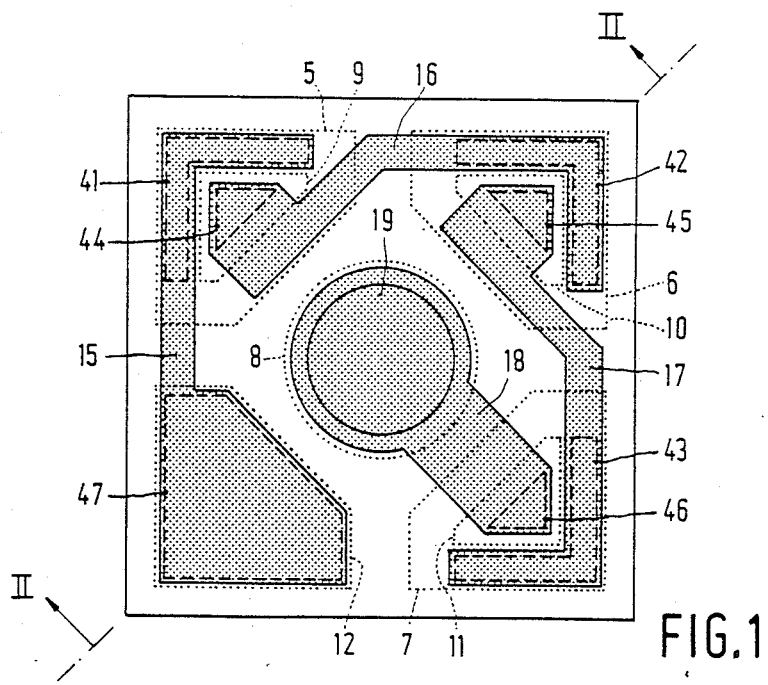

United States Patent [19]

Peters

[11] Patent Number: 4,789,647
[45] Date of Patent: Dec. 6, 1988

[54] METHOD OF MANUFACTURING A SEMICONDUCTOR DEVICE, IN WHICH A METALLIZATION WITH A THICK CONNECTION ELECTRODE IS PROVIDED ON A SEMICONDUCTOR BODY

[75] Inventor: Johannes S. Peters, Nijmegen, Netherlands

[73] Assignee: U.S. Philips Corporation, New York, N.Y.

[21] Appl. No.: 1,067

[22] Filed: Jan. 7, 1987

[30] Foreign Application Priority Data

Jan. 8, 1986 [NL] Netherlands ............... 8600021

[51] Int. Cl.⁴ .................................... H01L 21/283
[52] U.S. Cl. ................................ 437/190; 437/192; 437/209; 437/183; 437/246; 156/652; 156/656; 357/71
[58] Field of Search ............... 29/588, 589, 590, 591; 427/89, 91; 357/71; 156/652, 656; 437/192, 209, 183, 245, 246, 189, 228, 225

[56] References Cited

U.S. PATENT DOCUMENTS

| | | |
|---|---|---|
| 3,386,894 | 6/1968 | Steppat ............... 427/89 |
| 3,393,091 | 7/1968 | Hartmann et al. ............... 427/91 |
| 3,551,196 | 12/1970 | Herczog et al. ............... 427/91 |
| 3,650,826 | 3/1972 | Ganser ............... 427/91 |
| 3,761,309 | 9/1973 | Schmitter et al. ............... 427/91 |
| 4,042,951 | 8/1977 | Robinson et al. ............... 357/71 |
| 4,042,954 | 8/1977 | Harris ............... 29/589 |
| 4,187,599 | 2/1980 | Flowers et al. ............... 29/590 |
| 4,299,680 | 11/1981 | Fontana, Jr. et al. ............... 156/643 |
| 4,396,900 | 8/1983 | Hall ............... 156/656 |
| 4,410,622 | 10/1983 | Dalal et al. . |
| 4,505,029 | 3/1985 | Owyang et al. ............... 29/589 |
| 4,507,852 | 4/1985 | Karulkar ............... 29/590 |
| 4,576,678 | 3/1986 | Shibata ............... 156/652 |

*Primary Examiner*—Brian E. Hearn
*Assistant Examiner*—Kevin McAndrews
*Attorney, Agent, or Firm*—Paul R. Miller

[57] ABSTRACT

A method of manufacturing a semiconductor device comprising a semiconductor body (1), of which a surface (13) is provided with a metallization (15,16,17,18) with a thick connection electrode (19). The metallization is formed in a first metal layer (49) and the connection electrode is formed in a second metal layer (51). Between these metal layers is provided a third metal layer (50), which serves as an etching stopper during the formation of the connection electrode. During a single deposition step, the three metal layers (49,50,51) are provided, after which first the connection electrode and then the metallization are formed by etching. By providing the three metal layers in a single deposition step, the number of processing steps for manufacturing the semiconductor device is limited and it is moreover achieved that the adhesion between connection electrode (19) and metallization (15,16,17,18) is an optimum.

5 Claims, 2 Drawing Sheets

METHOD OF MANUFACTURING A SEMICONDUCTOR DEVICE, IN WHICH A METALLIZATION WITH A THICK CONNECTION ELECTRODE IS PROVIDED ON A SEMICONDUCTOR BODY

The invention relates to a method of manufacturing a semiconductor device comprising a semiconductor body, one surface of which is provided with a metallization with a thick connection electrode and an insulating layer covering the metallization except at the area of the connection electrode with the metallization being formed in a first metal layer and the connection electrode being formed in a second metal layer by etching, while a third metal layer is provided between these metal layers, which third metal electrode can serve as an etching stopper during the formation of the connection electrode.

Such a method is particularly suitable for the manufacture of semiconductor devices, the semiconductor body of which is clamped within a fused glass envelope between two electrodes. One of these two electrodes is in contact with the connection electrode present on the surface, while the other electrode is in contact with the side of the semiconductor body remote from this surface.

The German Patent Application No. 2428373 discloses a method of the kind mentioned in the opening paragraph, in which, after the first metal layer has been provided on the surface of the semiconductor body and the metallization has been formed therein, a layer of insulating material is deposited over the whole surface. At the area at which the metallization has to be provided with the thick connection electrode, a window is etched into the insulating layer, after which the third and the second metal layer are successively provided over the entire surface. The connection electrode is formed in this double metal layer.

The known method desribed has the disadvantage that it can be carried out only with the aid of a comparatively large number of processing steps. Moreover, it has been found that the adhesion between metallization and connection electrode sometimes leaves much to be desired.

The invention has inter alia for its object to provide a method in which it is possible to manufacture a semiconductor device comprising a semiconductor body which is provided with a metallization with a thick connection electrode with the aid of a comparatively small number of processing steps, the adhesion between metallization and connection electrode being an optimum.

For this purpose, according to the invention, the method mentioned in the opening paragraph is characterized in that during a single deposition step the first, the third, and the second metal layers are successively provided on the surface of the semiconductor body, after which first the connection electrode and then the metallization are formed, whereupon the insulating layer is provided, into which a window is etched at the area of the connection electrode. Since the third and second metal layers are provided in the same deposition step as the first metal layer, it is avoided that oxides or residues of etchants are present between the metal layers. The adhesion between the layers is an optimum.

The number of processing steps is essentially limited by the use of the invention because all metal layers—i.e. in order of succession the first, third and second metal layers—are provided in a single deposition step. Subsequently, a first etching mask is provided on these layers, whereupon uncovered layers are etched away from the second metal layer down to the third metal layer. The third metal layer serves as an etching stopper when etching the second metal layer. Subsequently, a second etching mask is provided, after which uncovered parts of the third and first metal layers are etched away. Finally, the insulating layer is provided, into which a window is etched at the area of the connection electrode.

During the formation of the metallization and the connection electrode, first the connection electrode is formed, after which the remaining part of the metallization is formed. This has the advantage that this remaining part of the metallization is etched in a comparatively thin metal layer (in practice 3 to 6 $\mu$m). As a result, fine details can be realized in this part of the metallization. If the patterns of the whole metallization should be formed first in all layers, the realization of thin details would be extremely difficult because the second layer is comparatively thick (in practice 30 to 60 $\mu$m).

Figure 2:
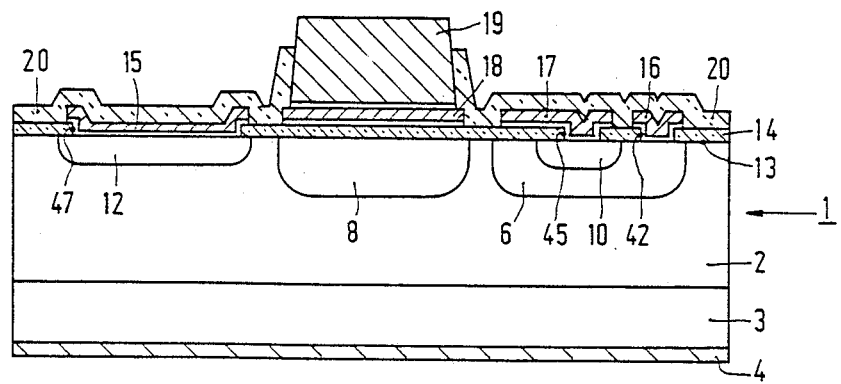
Figure 3:
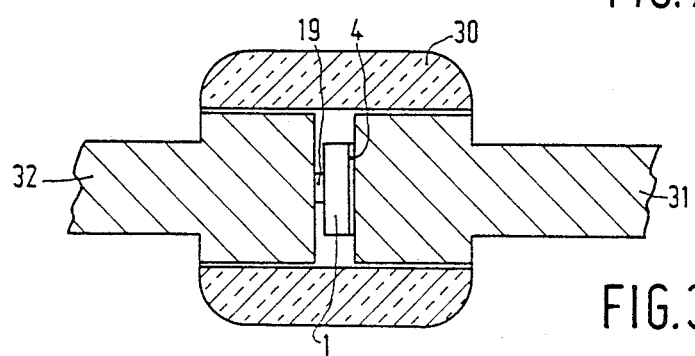

The invention will now be described more fully, by way of example, with reference to a drawing. In the drawing:

FIG. 1 shows diagrammatically in plan view a semiconductor device manufactured by means of the method according to the invention;

FIG. 2 is a diagrammatic sectional view of the device shown in FIG. 1 taken on the line II—II, FIG. 3 shows diagrammatically a glass envelope accommodating a semiconductor device of the type shown in FIGS. 1 and 2, and FIGS. 4, 5 and 6 show diagrammatically successive stages in the manufacture of the semiconductor device shown in FIGS. 1 and 2 by means of the method according to the invention.

The Figures are schematic and not drawn to scale, while for the sake of clarity more particularly the dimensions in the direction of thickness in the cross-sections are greatly exaggerated. In the Figures, corresponding parts are denoted by the same reference numerals.

The method according to the invention is particularly suitable for the manufacture of a semiconductor device of a kind as shown in FIGS. 1 and 2. This semiconductor device comprises a semiconductor body 1 comprising three bipolar transistors having a common n-type collector zone 2 having a doping concentration of about $10^{14}$ atoms/cm$^3$ and a thickness of about 90 $\mu$m. The collector zone 2 is connected by means of an n-type zone having a comparatively high doping concentration of about $10^{20}$ atoms/cm$^3$ and a thickness of about 7 $\mu$m to a metal electrode layer 4. The semiconductor body 1 further has three p-type base zones 5, 6 and 7 and a p-type separation zone 8 having a thickness of about 30 $\mu$m and a doping concentration of about $10^{18}$ atoms/cm$^3$. Finally, the semiconductor body 1 has three n-type emitter zones 9, 10 and 11 and a connection zone 12 having a thickness of about 7 $\mu$m and a doping concentration of about $10^{20}$ atoms/cm$^3$. The base zone 5 and the emitter zone 9 constitute with the common collector zone 2 a first transistor (5, 9), while the base zone 6 and the emitter zone 10 constitute with this collector zone a second transistor (6,10) and a base zone 7 and the emitter zone 11 constitute with this collector zone a third transistor (7,11).

The surface 13 of the semiconductor body 1 is provided with an insulating layer 14 of silicon oxide and a metallization consisting in this case of four parts. All parts consist of a substrate layer of titanium and a top layer of silver; for the sake of clarity, however, the parts are designed only by a single reference numeral. A first part 15 connects the contact zone 12 (and hence the common collector zone 2) to the base 5 of the first transistor (5,9), while a second part 16 connects the emitter 9 of the first transistor (5,9) to the base 6 of the second transistor (6,10) and a third part 17 connects the emitter 10 of the second transistor (6,10) to the base 7 of the third transistor (7,11) and the fourth part 18 connects the emitter of the fourth transistor (7, 11) to a thick connection electrode 19. This connection electrode 19 also comprises a substrate layer of titanium and a top layer of silver. The whole surface 13 of the semiconductor body is finally covered with an insulatng layer 20 of silicon nitride, which covers the metallization 15,16,17 and 18 except at the area of the connection electrode 19.

FIG. 3 shows diagrammatically how the device shown in FIGS. 1 and 2 can be mounted in a glass envelope 13. The semiconductor body 1 is arranged for this purpose with its metal electrode layer 4 and the thick connection electrode 19 between two electrodes 31 and 32, after which a soft glass tube is slipped over the enitre structure. The entire structure is then heated to a temperature of about 700° C., whereupon after cooling, the glass envelope 30 is formed, which adheres satisfactorily to the electrodes 31 and 32. Due to shrinkage stresses produced in the glass upon cooling, the semiconductor body is clamped between the electrodes. Thus, in this embodiment, an integrated circuit is present between the electrodes 31 and 32, which integrated circuit comprises three series-connected diodes, which are constituted by three series-connected base-emitter junctions. Such a circuit can be used as a voltage stabilizer.

Figure 4:
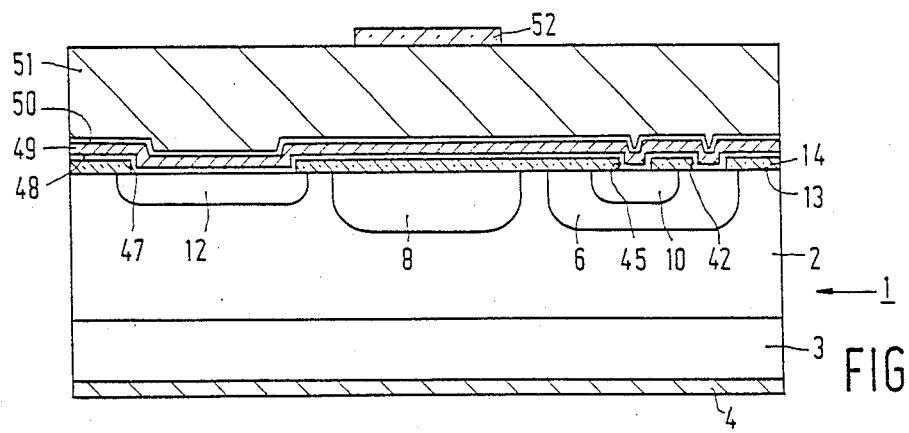
Figure 5:
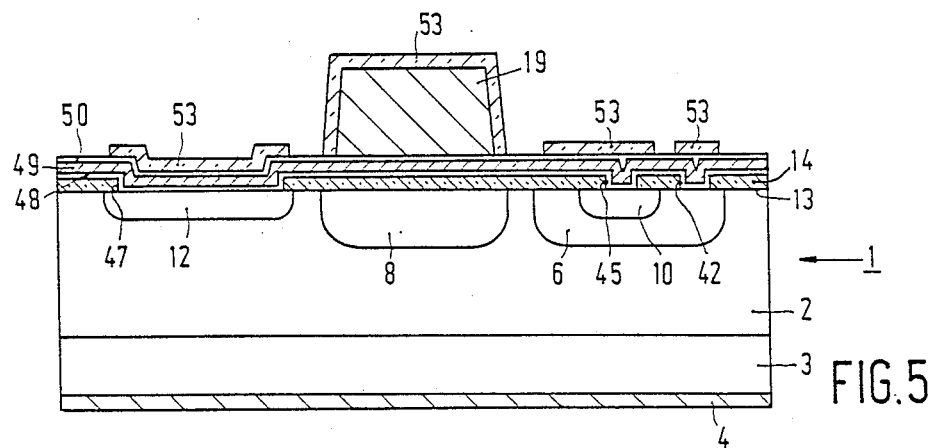
Figure 6:
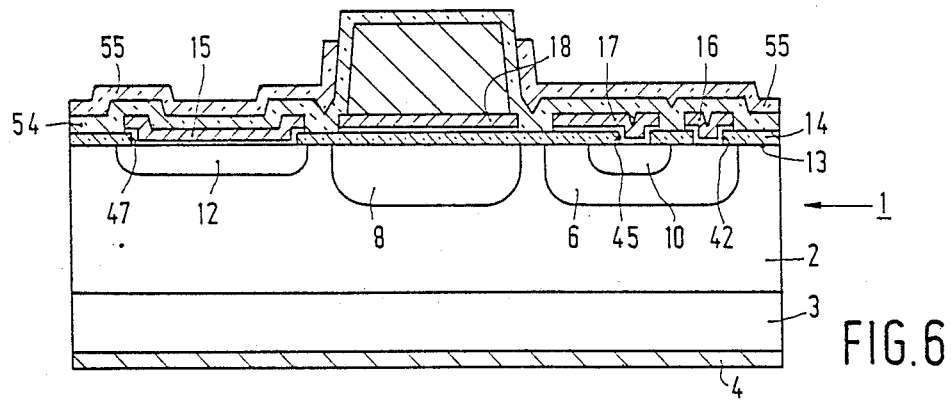

FIGS. 4, 5 and 6 show successive stages of the manufacture of the semiconductor device shown in FIGS. 1 and 2. The metallization with the parts 15, 16, 17 and 18 is then formed in a first metal layer and the connection electrode 19 is formed in a second metal layer by etching, while a third metal layer is provided between these metal layers and can serve as an etching stopper during the formation of the connection electrode 19.

The starting material is a semiconductor body 1, in which the various semiconductor zones 5, 6, 7, 8, 9, 10, 11 and 12 are provided in a usual manner and whose surface 13 is provided with the insulating layer 14 with windows 41, 42 and 43 for contacting the base zones 5, 6 and 7, with windows 44, 45 and 46 for contacting the emitter zones 9, 10 and 11, and with a window 47 for contacting the connecton zone 12. The separation zone 8 is not connected to the metallization in this embodiment.

A titanium layer 48 having a thickness of about 0.1 $\mu$m, a silver layer 49 having a thickness of about 4 $\mu$m, a titanium layer 50 having a thickness of about 0.2 $\mu$m and a thick silver layer 51 having a thickness of about 50 $\mu$m are now deposited in a single deposition step on the whole surface 13 of the semiconductor body 1. The titanium layer 48 serves as an adhesive layer between the silver layer 49 and the semiconductor zones 5,6,7,8,9,10, 11 and 12 and the insulating layer 14. Although the titanium layer 48 is of great advantage for the operation of the semiconductor device, it is essential for the formation of the metallizations 15,16,17 and 18 with the connection electrode 19 by means of the method according to the invention that during the single deposition step the layers 49, 50 and 51 are formed. The metallizations 15, 16, 17 and 18 are formed in the silver layer 49, referred to hereinbefore as the first metal layer, while the connection electrode 19 is formed in the silver layer 51, referred to hereinbefore as the second metal layer. During the formation of the connection electrode 19, the titanium layer 50, referred to hereinbefore as the third metal layer, serves as an etching stopper.

According to the invention, after a photolacquer mask 52 has been provided in a usual manner, first the connection electrode 19 is formed by etching away the parts of the silver layer 51 not covered by the photolacquer mask 52. The silver may be etched, for example, in a solution (1:1) of nitric acid and ferronitrate. The titanium layer 50, which is practically not attacked by the etching baths, then serves as an etching stopper. After the next photolacquer mask 53 has been provided in a usual manner, parts of the titanium layer 50 not covered by this mask are etched away in a mixture of nitric acid and hydrofluoride. Subsequently, the non-covered parts of the silver layer 49 and the titanium layer 48 are successively etched away. thus, the parts of the metallizations 15,16,17 and 18 are formed. Finally, the entire structure is covered in a usual manner by a silicon nitride layer 54, of which, after a photolacquer mask 55 has been provided in a usual manner, parts not covered by this mask are etched away. Thus, the semiconductor device shown in FIGS. 1 and 2 is manufactured.

Since the metal layers essential to the metallizations 15,16,17 and 18 and the connection electrode 19—i.e. in order of succession the first layer 49, the third layer 50 and the second layer 51—are provided in a single deposition step, the number of processing steps for the manufacture of the semiconductor device shown in FIGS. 1 and 2 is limited. During the formation of the metallization parts 15,16,17 and 18, the etching treatment is carried out in a comparatively thin layer so that comparatively fine details can be formed. This would not be the case if during the first etching treatment a pattern corresponding to the metallization parts 15,16,17 and 18 were etched in all the layers 49, 50 and 51 and only then the thick layer 51 were removed from the parts 15,16,17 and 18.

Since the metal layers 48,49,50 and 51 are provided in a single deposition step, It is avoided that oxides or residues of etchants are present between the metal layers. The adhesion between the layers is therefore an optimum.

During the single deposition step, preferably a first metal layer 49 of silver, a third metal layer 50 of titanium and a second metal layer 51 of silver are provided. Such a choice is particularly practical if the semiconductor device has to be accommodated in an envelope as shown in FIG. 3. In such a case, the entire semiconductor device is heated to a temperature of about 700° C., the semiconductor device being capable of withstanding this heating step without any problem. Although these metals are to be preferred, other choices are possible. For example, the first metal layer may alternatively consist of tungsten, platinum or a silicide, such as platinum silicide, while the third metal layer may alternatively consist of chromium and the second metal layer of copper.

As described already above, it is also of great advantage if during the deposition step before providing the first metal layer 49, the third metal layer 50 and the second metal layer 51 a metal adhesive layer 48 is provided. Preferably, the latter layer consists of titanium for the same reasons as described hereinbefore for the other metal layers 49, 50 and 51. A very suitable thickness for the adhesive layer is 0.05 to 0.15 $\mu$m.

Preferably, the first metal layer of silver is provided in a thickness of 3 to 6 $\mu$m, the third metal layer of titanium 50 is provided in a thickness of 0.1 to 0.3 $\mu$m and the second metal layer of silver 51 is provided in a thickness of 20 to 50 $\mu$m.

It will be appreciated that the invention is not limited to the embodiment described, but that many modifications are possible for a person skilled in the art without departing from the scope of the invention. For example, instead of three transistors, the device may also comprises a single diode or Zener diode, the first metal layer then forming an ohmic contact with the semiconductor body. Furthermore, the metallization may be provided with more than one connection electrode.

What is claimed is:

1. A method of manufacturing a semiconductor device comprising the steps of
    forming a semiconductor body having respective transistor zones,
    forming an insulating layer on said semiconductor body, said insulating layer having openings to at least some of said transistor zones,
    successively forming at least three metal layers on said insulating layer, said at least three metal layers including a first thin metal layer, a second thick metal layer, and a third thin metal layer formed between said first thin metal layer and said second thick metal layer,
    Wherein said second thick metal layer is formed with a thickness ranging from about 30 to 60 $\mu$m, said first thin metal layer is formed with a thickness ranging from about 3–6 $\mu$m, and said third thin metal layer is formed with a thickness ranging from about 0.1–0.3 $\mu$m,
    forming a masking layer on parts of said second thick metal layer,
    etching said second thick metal layer at unmarked parts to said third thin metal layer, said third thin metal layer acting on an etching stopper,
    forming a second masking layer on parts of said third thin metal layer and remaining parts of said second thick metal layer,
    etching exposed parts of said third thin metal layer and underlying parts of said first thin metal layer,
    forming a second insulating layer over the entire structure, and
    etching at least a part of said second insulating layer on said second thick metal layer to form a thick connection electrode.

2. A method according to claim 1, wherein said first thin metal layer is formed of silver, said third thin metal layer is formed of titanium, and said second thick metal layer is formed of silver.

3. A method according to claim 1 or claim 2, wherein a metal adhesive layer is formed on said insulating layer before forming said three metal layers.

4. A method according to claim 3, wherein said metal adhesive layer is formed with a thickness ranging from about 50–150 nm.

5. A method according to claim 2, wherein said second thick metal layer is formed with a thickness of about 50 $\mu$m.

* * * * *